(12) United States Patent
Wu et al.

(10) Patent No.: US 7,223,448 B2
(45) Date of Patent: May 29, 2007

(54) METHODS FOR PROVIDING UNIFORMITY IN PLASMA-ASSISTED MATERIAL PROCESSES

(75) Inventors: Han-Ming Wu, Cupertino, CA (US); He Long, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 10/396,990

(22) Filed: Mar. 24, 2003

(65) Prior Publication Data

US 2003/0226503 A1   Dec. 11, 2003

Related U.S. Application Data

(62) Division of application No. 09/823,528, filed on Mar. 30, 2001, now abandoned.

(51) Int. Cl.
C23C 16/00 (2006.01)
H05H 1/24 (2006.01)

(52) U.S. Cl. .......................... 427/569; 427/8; 427/585; 204/298.02; 204/298.11; 118/723.1; 156/345.48

(58) Field of Classification Search .................. 216/59, 216/67; 438/706; 156/345.48; 118/723.1; 204/298.11, 298.02; 427/8, 569, 585
See application file for complete search history.

(56) References Cited

U.S. PATENT DOCUMENTS

| | | | | |
|---|---|---|---|---|
| 4,450,787 A | | 5/1984 | Weakliem et al. | |
| 4,508,612 A | * | 4/1985 | Blackwell et al. | 204/298.11 |
| 4,987,284 A | * | 1/1991 | Fujimura et al. | 219/121.43 |
| 5,030,475 A | * | 7/1991 | Ackermann et al. | 427/572 |
| 5,126,165 A | * | 6/1992 | Akihama et al. | 427/572 |
| 5,391,275 A | * | 2/1995 | Mintz | 204/192.32 |
| 5,417,799 A | * | 5/1995 | Daley et al. | 216/24 |
| 5,421,893 A | | 6/1995 | Perlov | |
| 5,534,751 A | * | 7/1996 | Lenz et al. | 315/111.71 |
| 6,008,130 A | | 12/1999 | Henderson et al. | |
| 6,048,786 A | * | 4/2000 | Kudo | 438/622 |
| 6,103,070 A | * | 8/2000 | Hong | 204/192.12 |
| 6,184,148 B1 | * | 2/2001 | Nakamura | 438/715 |
| 6,322,661 B1 | | 11/2001 | Bailey et al. | |
| 6,350,317 B1 | | 2/2002 | Hao et al. | |
| 2005/0139317 A1 | * | 6/2005 | Wu et al. | 156/345.3 |

FOREIGN PATENT DOCUMENTS

JP   03208338   11/1991
JP   04-144130   * 5/1992

* cited by examiner

Primary Examiner—Shamim Ahmed
(74) Attorney, Agent, or Firm—Blakely, Sokoloff, Taylor & Zafman LLP

(57) ABSTRACT

A method for providing uniformity in plasma-assisted material processes. A shielding plate is implemented within a plasma chamber above a substrate. The dimensions, geometry, and location of the shielding plate are optimized to generate a desired ion flux in a plasma-assisted material process conducted in a plasma chamber.

8 Claims, 8 Drawing Sheets

Fig. 1 Sketch of shielding disk in plasma reactor.

METHODS FOR PROVIDING UNIFORMITY IN PLASMA-ASSISTED MATERIAL PROCESSES

This is a Divisional application of Ser. No. 09/823,528 filed Mar. 20, 2001, now abandoned.

FIELD OF THE INVENTION

The field of the invention relates generally to a plasma-assisted material process, and more particularly to control of process uniformity across substrate.

BACKGROUND OF THE INVENTION

Capacitively coupled plasma (CCP) reactors and high density plasma (HDP) reactors, such as inductively coupled plasma (ICP) reactors and electron cyclotron resonant (ECR) plasma reactors, have been widely applied in the semiconductor industry for plasma assisted material process, such as plasma enhanced chemical vapor deposition (PECVD) and plasma etch. A conventional plasma reactor, such as CCP, usually consists of two parallel plate electrodes in a chamber. The reactive nature of the discharged gas in the chamber is sustained due to the radio frequency (RF) voltage on the two electrodes. The typical pressure in the chamber ranges from $10^{-3}$–10 Torr. High voltage on the electrodes causes ion bombardment on the surface of a substrate.

HDP reactors, such as those of the ICP type, consist of two set RF coils located outside the plasma chamber. RF power is provided to the chamber by an inductive magnetic field. It is not necessary to have an electrode in the HDP reactor. In general, by applying RF bias voltage to the substrate one can independently control the ion bombardment energy in HDP.

Plasma-assisted material processes are generally carried out in a plasma chamber or reactor. To control the reaction rate across a reticle or wafer, the state of the art approach provides for the end user to adjust operational parameters. For example, the radio frequency (RF) power of the coil or neutral gas pressure may be adjusted. Additionally, the mass flow rate may be adjusted.

However, modification of the above parameters still yields a disproportionate etching or deposition rate on the surface of the substrate, i.e. sometimes significantly higher rates at the center of the substrate than at the edges. Thus, such modifications can yield, at best, only about a 2–3% uniformity across the substrate. Although this represents an improvement over processes performed without such modifications, this level of uniformity still does not meet the specifications for certain applications, such as for etching a quartz/chromium reticle.

With state of the art systems, the end user cannot do anything more to improve uniformity without sacrificing other qualities such as etch selectivity. The end user cannot make structural modifications to the reactor hardware itself, such as, adjustment of coil configuration, chamber size, and pedestal position. Such modifications could produce the desired improvements, but modifications to reactor hardware can only be made by the vendor. Thus, if heightened uniformity is to be achieved by the end-user, it should make use of conventional etching equipment.

There is thus a need for a means of attaining better plasma-enhanced material process uniformity using conventional equipment.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
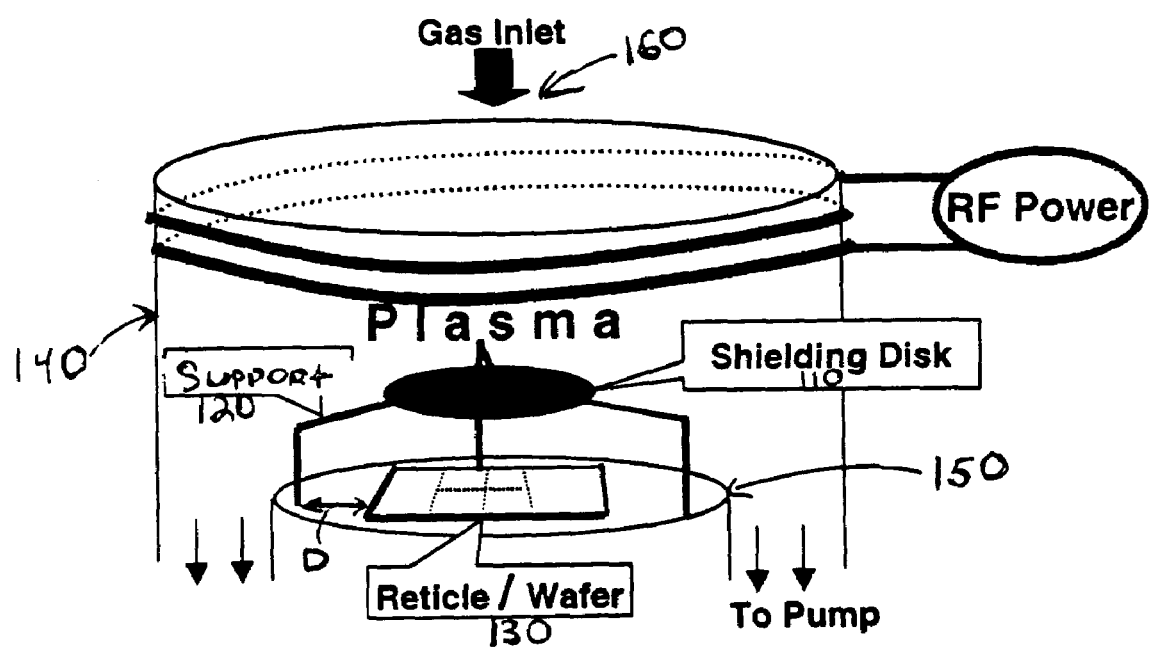
FIG. 1 is an illustration of a cross-sectional view of one embodiment of a shielding plate in a plasma reactor, in accordance with the present invention.

A shielding plate is placed in plasma for plasma-assisted material process uniformity improvement. An apparatus comprising a plasma chamber containing a plasma for a plasma-assisted material process upon a substrate; a shielding plate within the plasma chamber to actively direct ion flux to desired areas of the substrate; and a supporting structure to support the shielding plate within the chamber is disclosed.

The apparatus provides an effective way to control ion flux and optimize the uniformity of plasma-assisted material processes, such as etching or deposition, across the surface of a substrate. It can also provide a way to localize reactions on the substrate. It can also minimize the macro-loading effect due to non-uniform accumulation of etching by-products, which may cause substrates to become unbalanced. It may also be favorable to current critical dimension control processes. The apparatus can result in cost savings in the material processes.

The apparatus comprises a shielding plate within a plasma reactor to regulate the material process. The term plasma-assisted material process will be used interchangeably with the terms plasma-assisted etching process and plasma enhanced chemical vapor deposition (PEVCD). Further, these terms may be abbreviated to etching and deposition. In other words, the apparatus is not limited to etching processes. The term plasma reactor will be used to mean an inductively coupled plasma reactor or other plasma reactor. The plate can regulate ion flux across the substrate during an etch process. Ion flux is the quantity of ions diffusing through and perpendicular to a unit cross-sectional area (i.e., the substrate) per unit time. An ion is an atom or molecule with a positive charge because electrons have been removed or a negative charge because electrons have been added. Negative ions do not diffuse to the chamber wall and substrate because of the electrostatic field in plasma. A plasma is a discharged gas in which some individual atoms are ionized though the total number of positive and negative charges is equal, maintaining an overall electrical neutrality.

The etch rate is the rate of controlled surface erosion upon a substrate. In one embodiment, the substrate subject to plasma-assisted etching is a reticle. In another embodiment, the substrate is a silicon wafer. The terms substrate, reticle, and wafer will be used interchangeably. In other embodiments, the substrate is polysilicon, aluminum or copper. Although the detailed mechanism of why ions play such a critical role in the etching process is still unclear, it is believed that etch rate is proportional to both ion flux and active species flux. Therefore, etch uniformity can be optimized by controlling these fluxes. Similarly, ion flux is proportional to the rates of PECVD.

The radius and the location of the plate may depend upon the type of etch process performed. By adjusting the size, location and geometry of the plate within the plasma reactor, the ion flux can be actively controlled.

FIG. 1 is an illustration of a cross-sectional view of one embodiment of a shielding plate in a plasma reactor, in accordance with the present invention. Shielding plate 110 is supported by support 120. Support 120 sets upon pedestal 150 within plasma reactor 140. The term plasma reactor will be used interchangeably with plasma chamber. In one embodiment, the plate 110 is supported by three supports 120. In an alternate embodiment, shielding plate 110 is suspended from above the reticle 130. Alternatively, shielding plate 110 is located to the side of reticle 130. Reticle 130 sets upon pedestal 150. Neutral, reactive gas, such as but not limited to $CF_4$ or $CHF_3$ enters chamber 140 through gas inlet 160. When the neutral gas enters the strong electrical field within chamber 140, it becomes a plasma. The plasma fills chamber 140 and ions flow anisotropically through the plasma sheath and hits the wafer vertically. Anisotropic flow varies with direction. The presence of the shielding plate 110 directs ion flux with respect to the substrate surface 130. In one embodiment, plasma-enhanced chemical vapor deposition (PECVD) is performed using the plate. In another embodiment, $SiO_2$ etching is performed.

Since solid objects are plasma density sinks, to minimize the signature effect of the support 120, the distance D between the support and the reticle may be made much larger than mean free path of the etching particles, primarily electrons and ions. The mean free path is the distance that an ion, electron or atom travels without collision. In one embodiment, the distance between the support and the reticle is 2–3 times greater than the mean free path. It is also preferable for the diameter of the support to be much smaller than mean free path.

Figure 2:
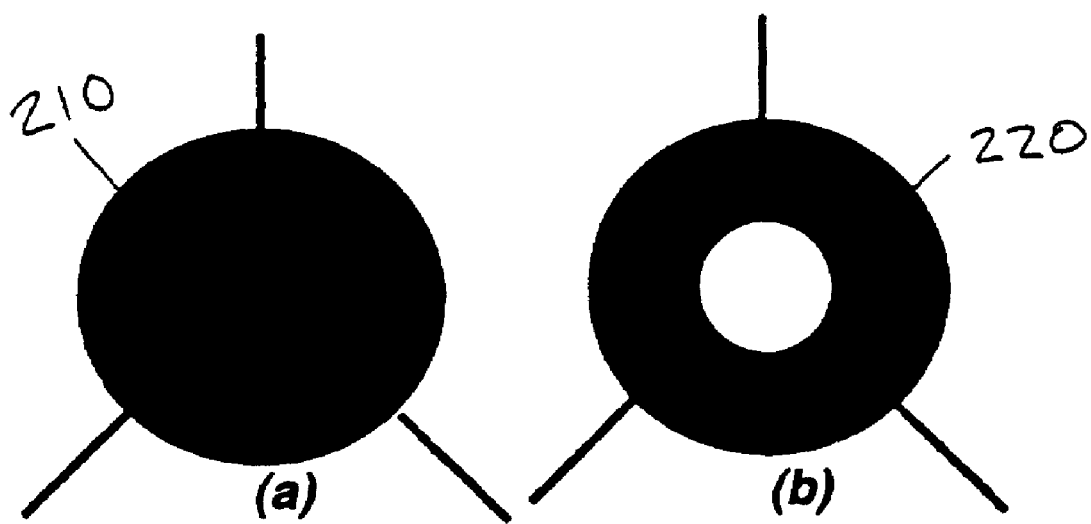
FIG. 2 is an illustration of a top-view of two embodiments of shielding plates, in accordance with the present invention.

FIG. 2 is an illustration of a top-view of two embodiments of shielding plates, in accordance with the present invention. In one embodiment, shielding plates are circular. The size, shape and geometry of the shielding plate is sufficient to cause ion flux from plasma to reticle to be diverted in some way. By diverting ion flux, etch rates can be controlled. In one embodiment, the shielding disk is placed over the center of the reticle to reduce the higher etch rates that normally occur at the reticle center and provide for more uniform etching. In another embodiment, the disk is placed above one side of the reticle to provide for decreased etch rates in that side area.

Shielding plate 210 is a solid circle which may reduce etch rates in the central area of reticle 130 (FIG. 1). In another embodiment, shielding plate 220 has a radial cutout to suppress etch rates in the edge area of the reticle 130 (FIG. 1). A cutout is perforation in a shielding plate. This can achieve axisymmetric etch rate adjustment. In another embodiment, non-radial perforations may be made in the plate to concentrate the etching within a certain area of the reticle.

The diameter and thickness of a plate may depend upon the size of the plasma chamber and the reticle. In one embodiment, the dimensions of the plate are dependent upon the dimensions of the chamber and reticle. For example, the plate fractionally smaller than the reticle. In one embodiment, the plate has a thickness of 2–5 mm. It is preferable for the plate to have rounded corners on its edges to reduce the risk of local electrostatic discharge. In one embodiment, the plate and any supporting members are made of a dielectric material, such as but not limited to quartz or a ceramic. A dielectric material is an insulator through which electrical current cannot flow.

Figure 3:
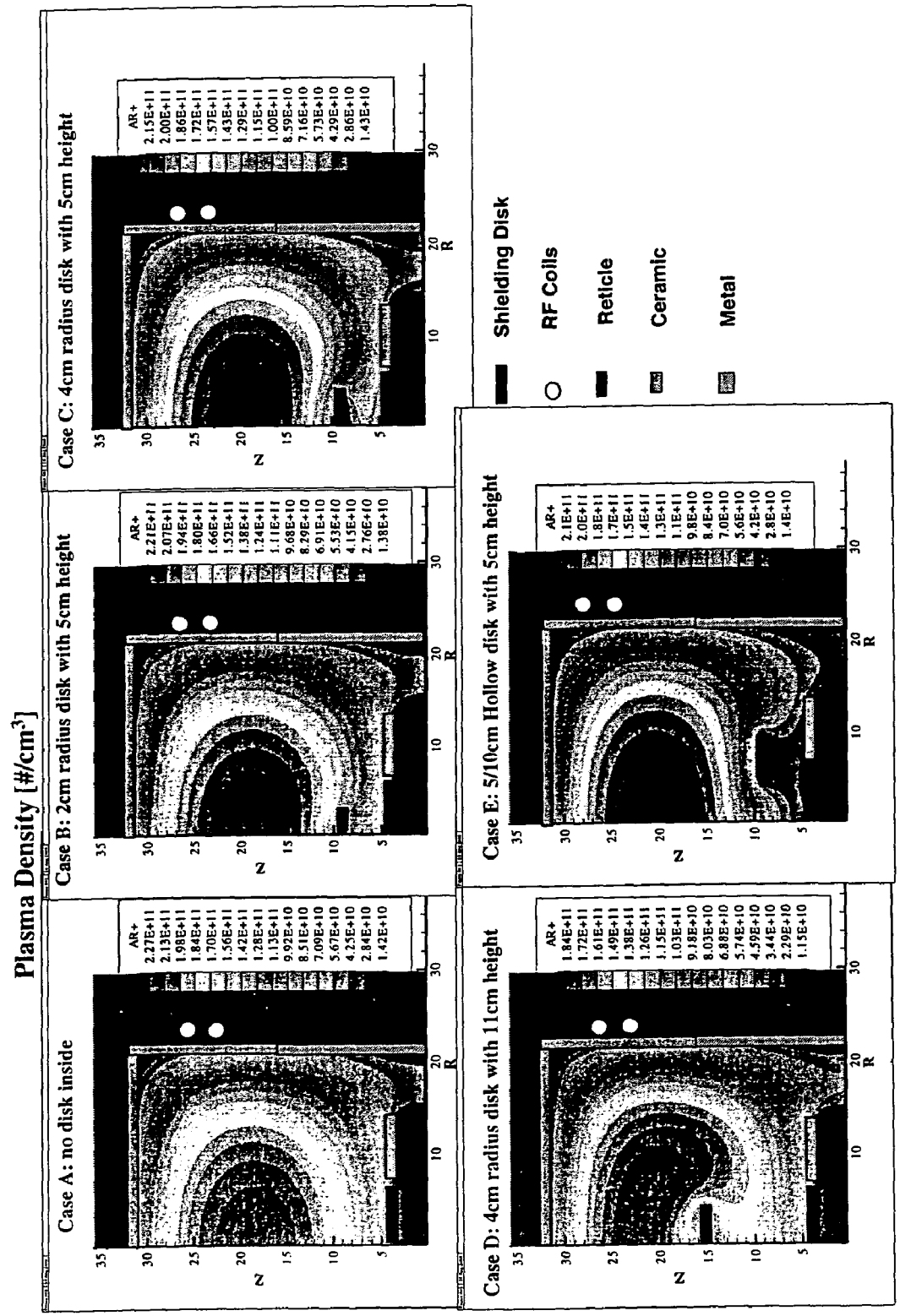
FIG. 3 is an illustration of a cross-section of plasma densities for various embodiments of plate usage, in accordance with the present invention.
Figure 4:
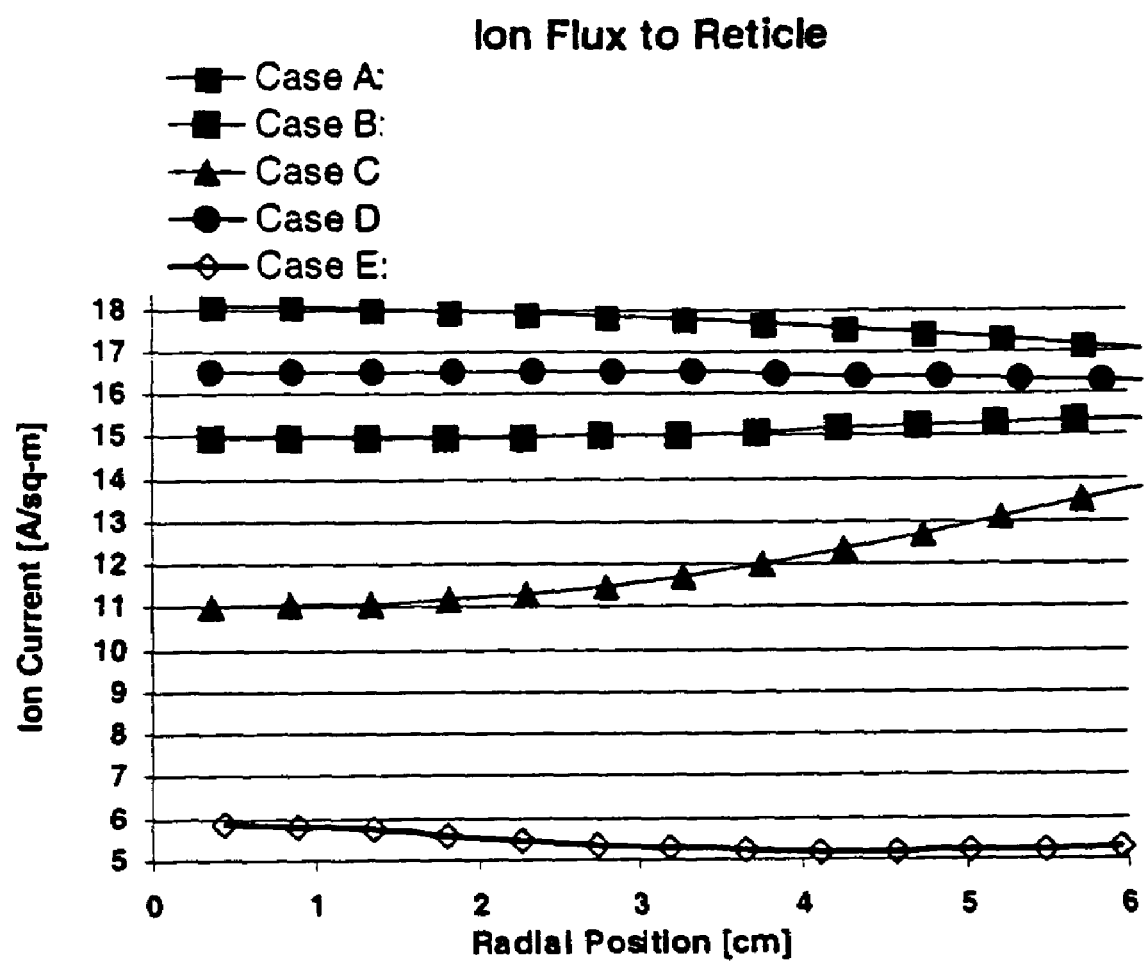
FIG. 4 is an illustration of radial ion flux rates for the various embodiments of plate usage in FIG. 3, in accordance with the present invention.
Figure 5:
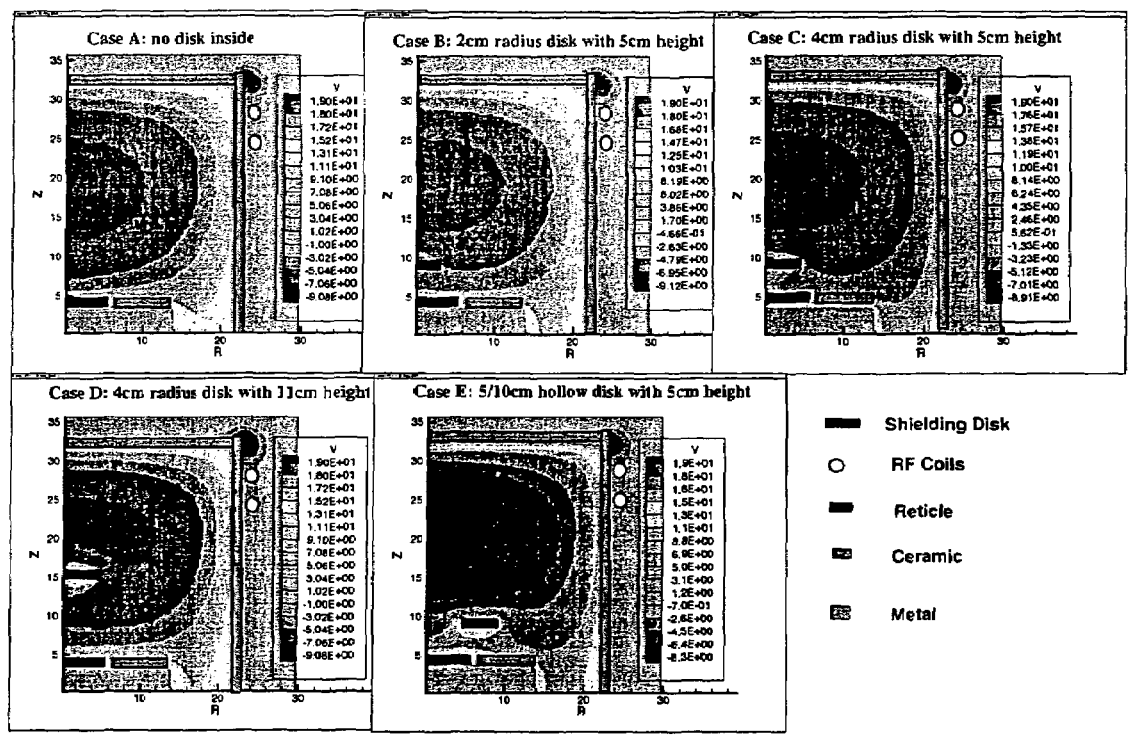
FIG. 5 is an illustration of a cross-section of plasma potentials for the various embodiments of plate usage in FIG. 3, in accordance with the present invention.

FIGS. 3, 4 and 5 demonstrate how numerical simulation can be used to optimize disk properties. In one embodiment, disk optimization is carried out by numerical simulation.

FIG. 3 is an illustration of a cross-section of plasma densities for various embodiments of plate usage, in accordance with the present invention. Plasma density is synonymous to electron density. Plasma densities are measured in number of ions/$cm^3$ at 4 mTorr Ar and 600 W of ICP radio frequency power. In the case A embodiment, there was no disk was in the plasma chamber. In the case B embodiment, a 2-cm radius disk was placed at a height of 5 cm above the reticle. In the case C embodiment, a 4-cm radius disk was placed at 5 cm above the reticle. In the case D embodiment, a 4-cm radius disk was placed at 11 cm above the reticle. In the case E embodiment, a hollow disk, or disk with a radial cutout, having a 10-cm outer radius and a 5-cm inner radius was placed at a height of 5 cm above the reticle. The projected density contour lines changed significantly in situations where a disk was present in the chamber. In embodiments B, C, and D where solid disks were used, plasma density in the central area of the reticle was suppressed. In the case E embodiment, a hollow disk suppressed the density at the outer edges of the reticle, because plasma can penetrate the hole in the disk. In yet another embodiment, the location of the disk is altered depending upon changes in chamber pressure or other variables.

FIG. 4 is an illustration of radial ion flux rates for the various embodiments of plate usage in FIG. 3, in accordance with the present invention. Ion flux is equal to plasma density multiplied by ion velocity. Ion fluxes across the reticle are measured in terms of a delta value which is equal to the=(maximum ion flux−minimum ion flux)/(average ion flux). The case A embodiment again represents the conventional approach without a disk in plasma. In the embodiments of cases A–E, the disks are of the same size, geometry and location as the corresponding disks in FIG. 3. The embodiment of case D, a 4 cm radius disk placed at a height of 11 cm above the reticle, produced the best uniformity of ion flux across the surface of the reticle and therefore the most uniform etch rate. The delta value of case D was only 1.5%, as compared to 5% in the Case A embodiment, where no shielding disk was present.

FIG. 5 is an illustration of a cross-section of plasma potentials for the various embodiments of plate usage in FIG. 3, in accordance with the present invention. Plasma potential are measured at 4 mTorr Ar 600 W ICP power. Plasma potential provides that when ion flux emanates from plasma to the reticle, the ions obtain energy from the surrounding electrical field. This energy is proportional to the potential difference between the reticle and the plasma. With increased potential and RF bias, ion bombardment upon the reticle becomes more energetic. Ion bombardment is therefore proportional to the potential difference between the reticle and the plasma.

Five embodiments, cases A–E, are represented, each with plate geometry, size and location corresponding to that in FIG. 3. To achieve uniform ion bombardment it is desirable that potential contour lines be as close to parallel to the plane of the reticle as possible. The case D embodiment therefore provides the most uniform etching because its potential contour lines are nearly parallel to the reticle.

Etching is primarily controlled by two factors, 1) ion and etchant fluxes, and 2) energy flux. Energy flux equals mass flux multiplied by the energy carried by each ion. Mass flux is the quantity of mass diffusing through and perpendicular to a unit cross-sectional area per unit time. Energy is proportional to plasma potential. In order to achieve uniform etching, it is necessary to achieve uniform ion and active neutral fluxes as well as uniform energy flux.

Figure 6:
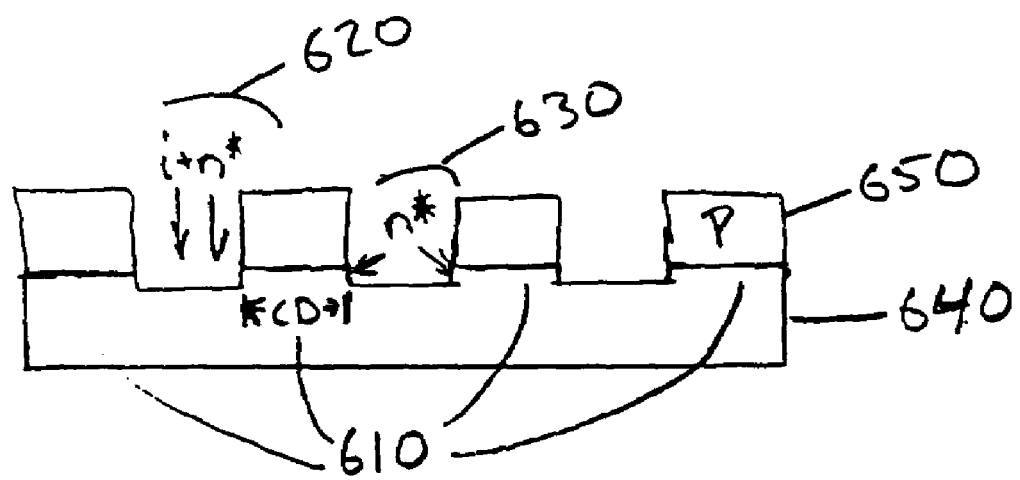
FIG. 6 is an illustration of a cross-section of one embodiment of a critical dimension control process, in accordance with the present invention.

FIG. 6 is an illustration of a cross-section of one embodiment of a critical dimension control process, in accordance with the present invention. Vertical etching 620 of the reticle 640 is carried out by ions (i) and metastable neutrons (n*). Horizontal etching 630, however, can be carried out only by neutrons (n*). Shielding disks may be used to regulate the n*/i+n* ratio and control the rates of horizontal and vertical etching. By this means, the desired critical dimensions 610 for an etching process may be generated. Photoresistors or mask 650 on top of reticle 640 prevent etching in the areas of the reticle that are not to be etched. In one embodiment, CD 610 are tailored to fit the requirements of the particular etching process involved.

Figure 7:
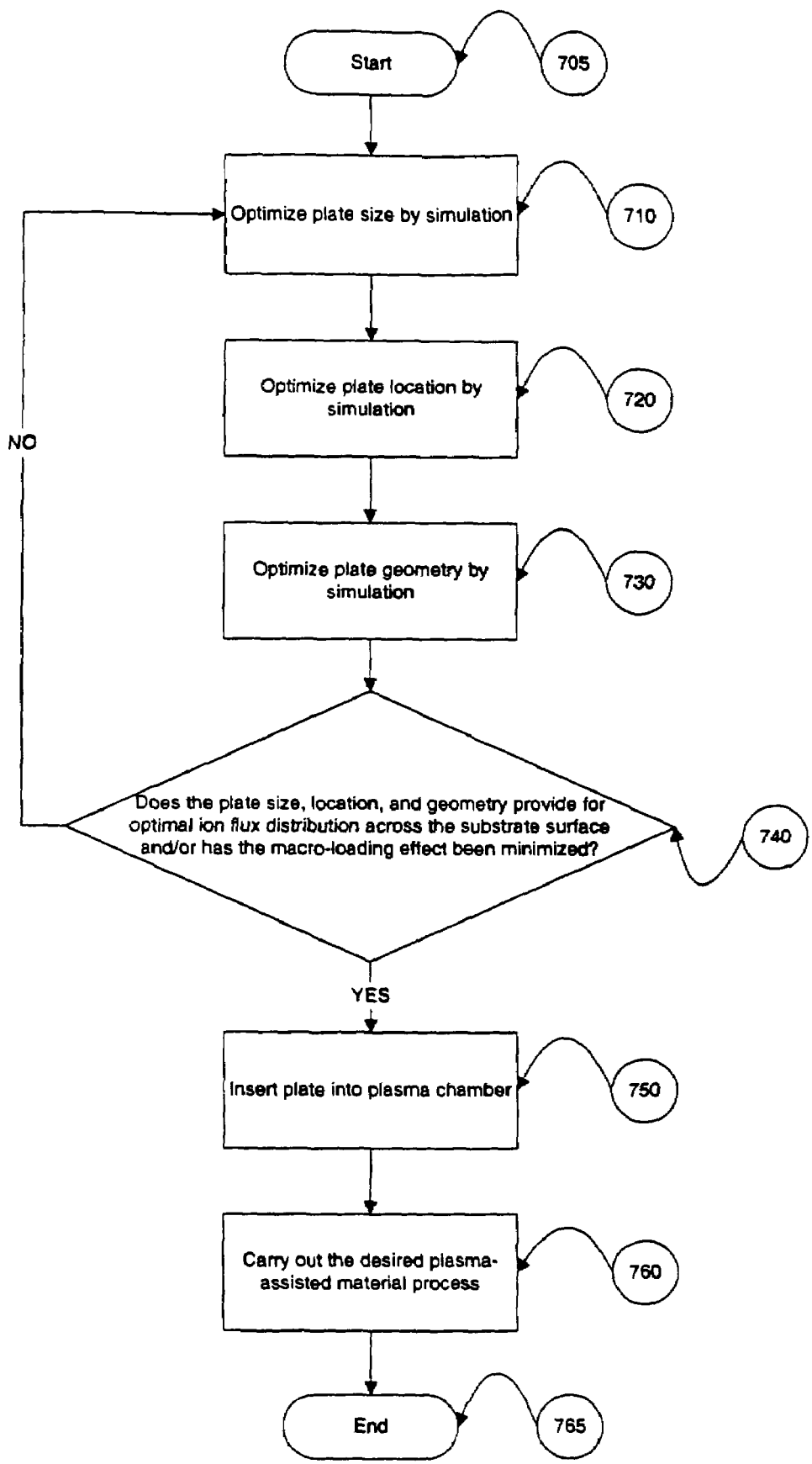
FIG. 7 is a flow diagram for one embodiment of a method for optimizing plasma-assisted material process uniformity, in accordance with the present invention.

FIG. 7 is a flow diagram for one embodiment of a method for optimizing plasma-assisted material process uniformity, in accordance with the present invention. At block 705, the optimization process begins. Optimization is based upon the type of material process to be performed and the special needs of each process. At block 710, the shielding plate size is optimized by simulation. For example, if the process requires that the etching rate be minimized in a relatively small area of the reticle, then a smaller disk may be placed above the area. At block 720, the plate location is optimized by simulation. For example, if the process requires that the etching rate over the upper left hand corner of the reticle be minimized, then a plate can be placed above the upper left hand corner area. The height of the plate above the reticle may also be optimized to achieve the desired ion flux. At block 730, the plate geometry is optimized by simulation. For example, if the process requires that the etching rate be minimized around the edges of the reticle, then a hollow disk, or disk with a cutout, can be used. In one embodiment, optimizing plate geometry includes making one or more perforations in the plate for localized etching. In general, the presence of a plate above an area of substrate decreases the etch rate in that area. In one embodiment, the optimizations in blocks 710, 720, and 730 are carried out by numerical simulation. At block 740, a determination is made of whether the plate size, location, and geometry provide for the optimal ion flux distribution across the substrate surface and/or whether the macro-loading effect has been minimized. The macro-loading effect is caused by the non-uniform accumulation of etching by-products across the substrate. For example, in one embodiment, etching by-products are more heavily concentrated at the center of the substrate. This causes the etching rate to be decreased at the center. A shielding plate may be placed above the substrate center to prevent ion flux to the center and spread the etching by-products uniformly across the substrate. If the parameters are not optimal at block 740, the process returns to block 710 for further optimization. When plate size, location, and geometry have been optimized, the plate is inserted into the plasma chamber at block 750. The presence of the plate diverts ion flux from areas of the substrate beneath the plate. At block 760, the desired plasma-enhanced material process is carried out. At block 765, the process ends.

Figure 8:
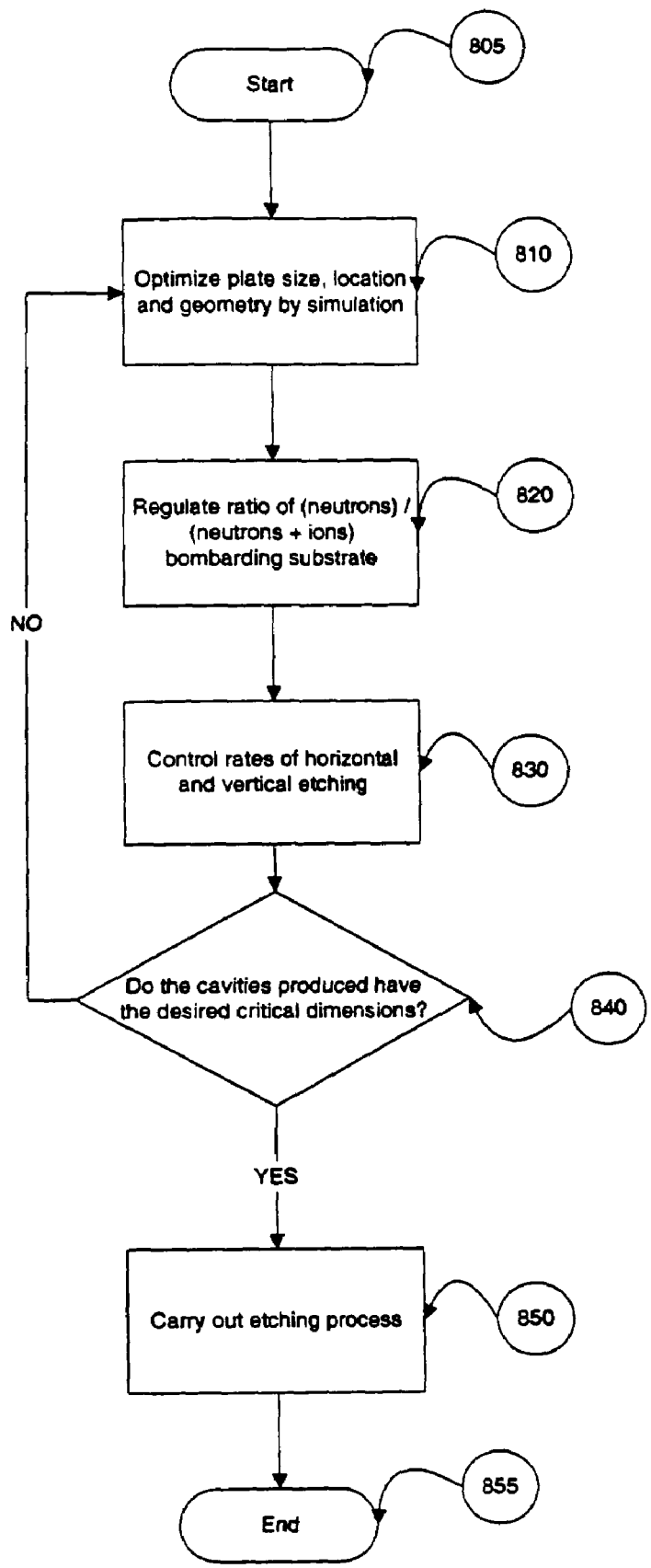
FIG. 8 is a flow diagram for one embodiment of a method for optimizing a critical dimension control process, in accordance with the present invention.

FIG. 8 is a flow diagram for one embodiment of a method for optimizing a critical dimension control process, in accordance with the present invention. At block 805, the process begins. At block 810, the plate size, location, and geometry are optimized as in FIG. 7. At block 820, the ratio of (neutrons)/(neutrons+ions) bombarding the plate is regulated by the presence of the plate. For example, the plate can reduce the ion flux in a certain area of the substrate and thereby increase the relative number of neutrons in that area. This, in turn increases the rate of horizontal etching upon the substrate and widens the critical dimensions of the etched cavity. For example, in a chromium etching process, where etching rates are higher at the reticle center, producing a deeper cavity than at the reticle sides, a plate could be placed over the center of the reticle to increase horizontal etching rates. By this, the different cavities across the substrate would have a more uniform width. At block 830, the rates of horizontal and vertical etching are controlled. At block 840, a determination is made of whether the cavities produced have the desired critical dimensions. If not, the process returns to block 810 to optimize plate size, location, and geometry. If the critical dimension process is optimized at block 840, then the process proceeds to block 850. In one embodiment, blocks 820 and 830 are carried out by simulation. At block 850, the etching process is carried out. At block 855, the process ends.

It will be further appreciated that the instructions represented by the blocks in FIGS. 7 and 8 are not required to be performed in the order illustrated, and that all the processing represented by the blocks may not be necessary to practice the invention.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method comprising:

optimizing dimensions, geometry, and a location of a shielding disk above a reticle in a chamber through a series of numerical simulations of ion flux to reticle of different disks to generate a desired ion flux in a plasma-assisted deposition process conducted in a plasma chamber; and carrying out the deposition process upon the reticle by the ion flux generated.

2. The method of claim 1 further comprising performing the optimization process such that a set of numerically simulated plasma potential contour lines are as close to parallel to the plane of a simulated reticle surface as possible.

3. The method of claim 1 further comprising optimizing the uniformity of energy flux across the reticle surface.

4. The method of claim 1 wherein said deposition process is a Plasma Enhanced Chemical Vapor Deposition Process (PECVD).

5. A method, comprising:
- determining ion flux across a reticle by a numerical simulation using a series of shielding disks comprising varying a dimension, a geometry and a location of the shielding disks in a chamber;
- positioning a shielding disk within the chamber at a determined location based on the numerical simulation; and
- depositing a material on the reticle with an ion flux generated with a shielding disk located in a plasma of the chamber.

6. The method of claim 5 further comprising performing the determination process such that a set of numerically simulated plasma potential contour lines are as close to parallel to the plane of a simulated reticle surface as possible.

7. The method of claim 5 further comprising optimizing the uniformity of energy flux across the reticle surface.

8. The method of claim 5 wherein said process is a Plasma Enhanced Chemical Vapor Deposition Process (PECVD).

* * * * *

UNITED STATES PATENT AND TRADEMARK OFFICE
CERTIFICATE OF CORRECTION

PATENT NO. : 7,223,448 B2 Page 1 of 1
APPLICATION NO. : 10/396990
DATED : May 29, 2007
INVENTOR(S) : Han-Ming Wu and Long He It is certified that error appears in the above-identified patent and that said Letters Patent is hereby corrected as shown below:

Title Page item 75
The second-named inventor was listed as "first name-He," "last name-Long." The correct order of the second-named inventor is --first-name-Long--, --last name-He.--

Signed and Sealed this

Thirtieth Day of October, 2007

JON W. DUDAS
*Director of the United States Patent and Trademark Office*